(12) United States Patent
Nikolov et al.

(10) Patent No.: US 7,759,926 B2
(45) Date of Patent: Jul. 20, 2010

(54) DYNAMIC PHASE OFFSET MEASUREMENT

(75) Inventors: Ludmil Nikolov, Chippenham (GB); Michael G. France, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 1183 days.

(21) Appl. No.: 11/362,289

(22) Filed: Feb. 24, 2006

(65) Prior Publication Data

US 2007/0201543 A1    Aug. 30, 2007

(51) Int. Cl.
  *G01R 23/00* (2006.01)
(52) U.S. Cl. .................. 324/76.52; 324/76.11
(58) Field of Classification Search .............. 324/76.52, 324/76.53, 76.11, 622; 702/69; 375/224, 375/226
  See application file for complete search history.

(56) References Cited

U.S. PATENT DOCUMENTS

| 3,701,023 | A | * | 10/1972 | Fang | 375/326 |
| 5,631,920 | A | * | 5/1997 | Hardin | 375/130 |
| 6,697,416 | B1 | * | 2/2004 | Jennings | 375/130 |
| 6,731,667 | B1 | * | 5/2004 | Lee et al. | 375/130 |
| 6,795,496 | B1 | * | 9/2004 | Soma et al. | 375/226 |
| 2004/0136440 | A1 | * | 7/2004 | Miyata et al. | 375/130 |
| 2005/0035798 | A1 | * | 2/2005 | Best | 327/157 |

OTHER PUBLICATIONS

JEDEC Solid State Technology Association, JEDEC Standard, Standard for Definition of 'CU878 PLL Clock Driver for Registered DDR2 DIMM Applications, JESD82-11, Sep. 2004, 18 pages.
Cypress Semiconductor Corporation, Differential Clock Buffer/Driver, CY2SSTV855, Document #38-07459 Rev. D, Revised May 7, 2004, 7 pages.
Mustafa, Kal, "Defining Skew, Propagation-Delay, Phase Offset (Phase Error)", Texas Instruments Application Report SCAA055—Nov. 2001.

* cited by examiner

*Primary Examiner*—Ha Tran T Nguyen
*Assistant Examiner*—Arleen M Vazquez
(74) *Attorney, Agent, or Firm*—Haynes and Boone, LLP

(57) ABSTRACT

In one embodiment, a method is provided for measuring a dynamic phase offset between a PLL's input clock and the PLL's feedback input clock, wherein the input clock is spread spectrum modulated in a spread spectrum mode and is not modulated in a static mode. The method includes: in the spread spectrum mode, measuring phase jitter between the input clock and the feedback input clock to form a spread spectrum phase jitter measurement; in the static mode, measuring phase jitter between the input clock and the feedback input clock to form a static phase jitter measurement; and comparing the spread spectrum phase jitter measurement to the static phase jitter measurement to determine the dynamic phase offset.

9 Claims, 3 Drawing Sheets

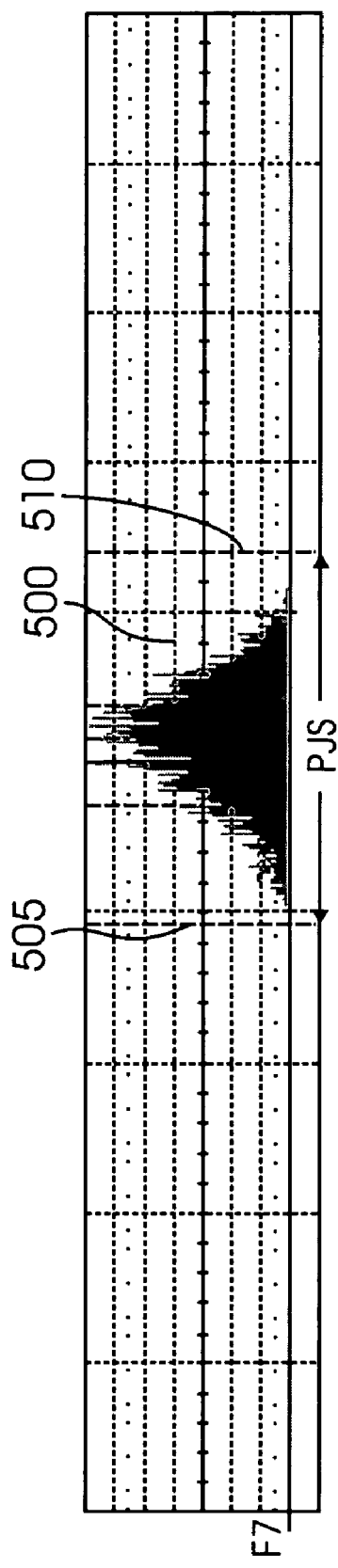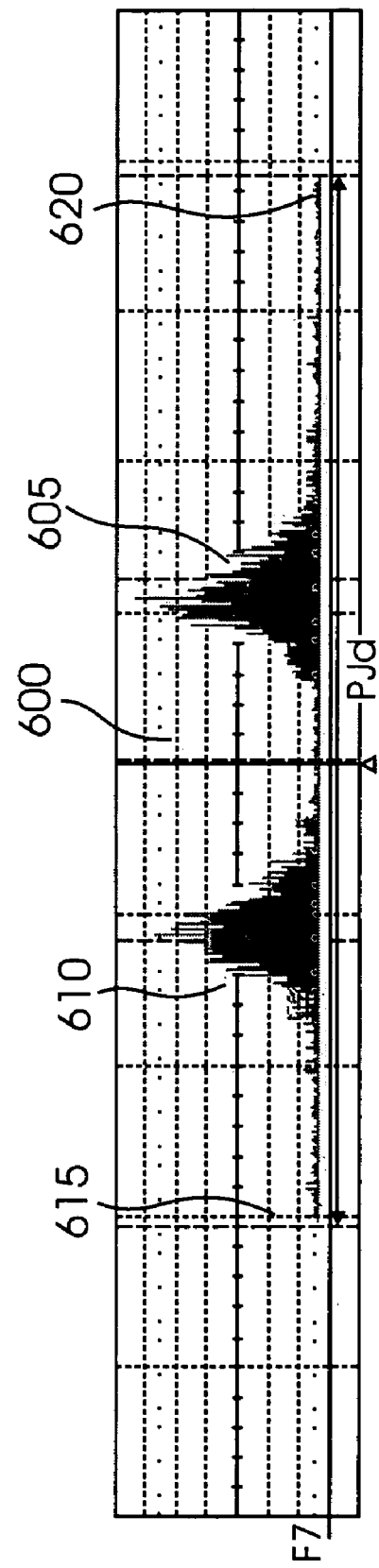

DYNAMIC PHASE OFFSET MEASUREMENT

TECHNICAL FIELD

The present invention relates generally to jitter measurement and, more particularly, to the measurement of dynamic phase offset.

BACKGROUND

Phase-locked loops (PLLs) are often used within digital circuits to generate an output clock signal responsive to an input clock. A digital integrated circuit such as a programmable logic device may have several PLLs generating a plurality of clock signals.

Because the operation of a digital integrated circuit occurs synchronously to the transition of its various clock signals, the accuracy of each clock signal is important for reliable operation. Ideally, each clock signal would have its edge transitions occur precisely when intended by a circuit designer. The drift of a clock signal from its intended transitions is deemed as jitter. As a clock jitters too much, various errors or glitches occur in circuit operation.

The measurement of jitter has been much studied and characterized because control of jitter is so important for proper circuit operation. In that regard, there are various types of jitter measurement such as cycle-to-cycle jitter and period jitter. In particular, a static phase offset jitter measurement has been defined between the input clock and feedback input clock for a PLL. Turning now to FIG. 1, the time relationship between a differential PLL input clock signal (CK) and a corresponding jittered differential feedback input clock (FBIN) is illustrated. As defined in the Joint Electron Device Engineering Council (JEDEC) standard JESD82-11, the skew between the edge transitions of CK and FBIN at the nth clock cycle [defined as $t_{(\phi)n}$] is averaged over a relatively large number of samples (clock cycles) to generate the static phase offset value $t_{(\phi)}$ according to the following expression:

$$t_{(\phi)} = \Sigma_1^{n=N} t(\phi)_n / N$$

where N is a sufficiently large number of samples. The JEDEC standard specifies 2000 samples.

Another important jitter measurement relates to the ability of a PLL or other type of frequency synthesizer to respond to a modulated input clock. For example, to reduce the electromagnetic interference (EMI) generated by a PLL, the input clock may be spread-spectrum modulated. Turning now to FIG. 2, a typical spread spectrum modulation (SSC1) frequency profile for a PLL input clock 200 is illustrated. As this input clock changes frequency, a corresponding PLL must be able to keep its output clock within acceptable jitter limits for proper operation of a digital circuit using the PLL's output clock. The JEDEC standard JESD82-11 defines a parameter known as the dynamic phase offset (DPO) that is commonly used to quantify the spread spectrum compliance of a PLL. However, unlike other well-known jitter parameters such as phase offset, the JEDEC standards set forth no definition or standard of how to measure DPO. Despite the ill-defined nature of DPO, manufacturers advertise the DPO performance of their circuits. However, because there is no standardized and accepted DPO test measurement method, a user cannot be sure of the test conditions used by a given manufacturer to establish their DPO performance.

Accordingly, there is need in the art for a test method and corresponding apparatus to properly measure the DPO performance of circuits such as PLLs or frequency synthesizers.

SUMMARY

In accordance with an embodiment of the invention, a method of measuring a dynamic phase offset between a PLL's input clock and the PLL's feedback input clock is provided, wherein the input clock is spread spectrum modulated in a spread spectrum mode and is not modulated in a static mode. The method includes: in the spread spectrum mode, measuring phase jitter between the input clock and the feedback input clock to form a spread spectrum phase jitter measurement; in the static mode, measuring phase jitter between the input clock and the feedback input clock to form a static phase jitter measurement; and comparing the spread spectrum phase jitter measurement to the static phase jitter measurement to determine the dynamic phase offset.

In accordance with another aspect of the invention, a time domain analytical instrument adapted to measure a dynamic phase offset between a PLL's input clock and the PLL's feedback input clock is provided, wherein the input clock is spread spectrum modulated in a spread spectrum mode and is not modulated in a static mode. The time domain analytical instrument is adapted to measure the dynamic phase offset by: in the spread spectrum mode, measure a phase jitter between the input clock and the feedback input clock to form a spread spectrum phase jitter measurement; in the static mode, measure the phase jitter to form a static phase jitter measurement; and compare the spread spectrum phase jitter measurement to the static phase jitter measurement to determine the dynamic phase offset.

In accordance with another aspect of the invention, A system is provided that includes: a PLL operable to process an input clock responsive to a feedback input clock; and a time domain analytical instrument coupled to receive the input clock and the feedback input clock, the time domain analytical instrument being adapted to measure phase jitter between the input clock and the feedback input clock while the input clock is spread spectrum modulated and while the input clock is not modulated, the time domain analytical instrument being further adapted to compare the phase jitter measured while the input clock is spread spectrum modulated to the phase jitter measured while the input clock is not modulated to determine a dynamic phase offset for the PLL.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 5 illustrates a histogram of phase jitter measurements obtained while a PLL input clock is maintained at a constant frequency; and FIG. 6 illustrates a histogram of phase jitter measurements obtained during spread spectrum modulation of a PLL input clock.

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 3:
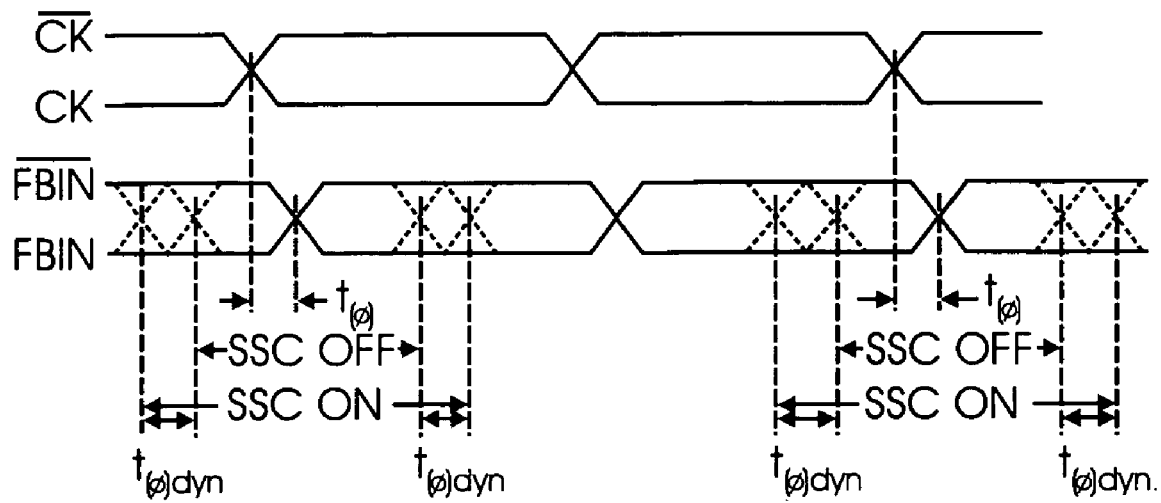
FIG. 3 illustrates the relationship between the dynamic phase offset (DPO) and the static phase offset with respect to a differential PLL feedback input clock (FBIN) and a corresponding differential PLL input clock (CK)

Turning now to FIG. 3, it can be seen that the dynamic phase offset (DPO) designated as $t_{(\phi)dyn}$ is not an increase in phase error as would be implied by the name "dynamic phase offset." Instead, the DPO is a measure of the increase in PLL phase jitter due to the modulation of its input clock.

To determine the increase in phase jitter when a PLL's input clock is spread spectrum modulated, the phase jitter between the input clock and the feedback input clock is measured, for example, over an integer N number of input clock cycle samples while the input clock is spread spectrum modulated. The phase jitter measurements are then repeated while the input clock is not spread spectrum modulated (being kept at a constant frequency). As discussed previously, the skew (phase jitter) between the edge transitions of a PLL's input clock and feedback input clock at the nth input clock cycle while the input clock is not spread spectrum modulated may be denoted as $t_{(\phi)n}$. Similarly, the skew (phase jitter) between the edge transitions of a PLL's input clock and feedback input clock at the nth clock cycle while the input clock is spread spectrum modulated may be denoted as $t(\phi)_{SSCn}$. The phase jitter measurements obtained while the input clock is spread spectrum modulated are compared to the phase jitter measurements obtained while the input clock is maintained at a constant frequency to determine the dynamic phase offset.

Figure 1:
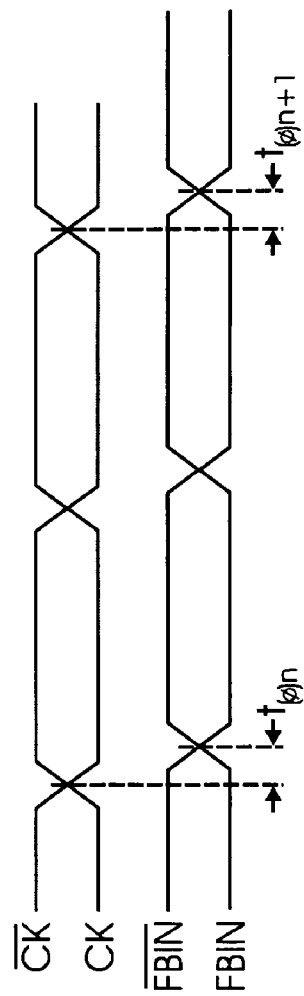
FIG. 1 is a time view of a PLL input clock and a corresponding jittered PLL feedback input clock.
Figure 2:
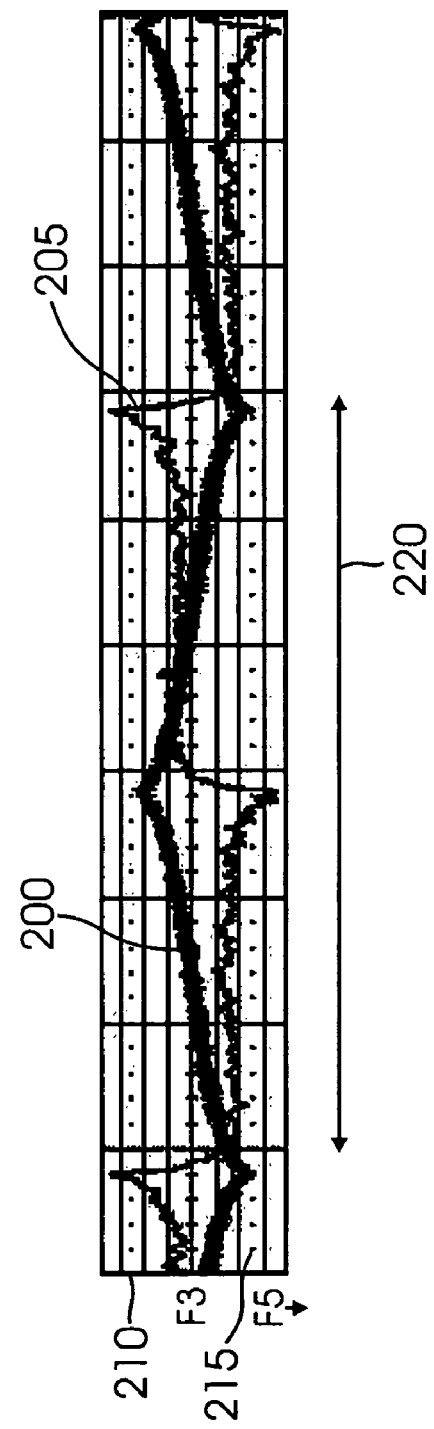
FIG. 2 illustrates the spread spectrum modulation of a PLL input clock and a time view of the corresponding PLL phase jitter.

Although a DPO determination may proceed as just described, a sufficient value for the number of samples N is undefined. A determination of the sufficient number of samples N may be aided by reference again to FIG. 2, which also illustrates a time view 205 of phase jitter in response to the spread spectrum modulation of input clock 200. Time view 205 may be obtained using the "jitter track" function on a suitable oscilloscope or other phase jitter measurement device. The input clock shows the conventional "Hershey kiss" modulation profile. For example, as the input clock is increased in frequency from a mean frequency value F3 it reaches a maximum frequency value 210. Similarly, as the input clock is decreased in frequency from the mean frequency value, it reaches a negative frequency value 215. The "Hershey kiss" profile may be seen at both of these maximum and minimum frequency values.

In response to the abrupt frequency changes for the input clock as it is spread spectrum modulated through its maximum and minimum frequencies, the phase jitter also sharply increases in absolute value at these points. Thus, the phase jitter is quite dynamic across a spread spectrum modulation period 220. To properly characterize the DPO, the values of $t(\phi)_{SSCn}$ should range across an entire spread spectrum modulation period. The number of input clock cycles (and hence number of $t(\phi)_{SSCn}$ samples) in a spread spectrum modulation period may be denoted as an integer $N_2$ according to the following expression:

$N_2 = T_{MOD}/T_{REF}$ where $T_{MOD}$ is the spread spectrum modulation period and $T_{REF}$ is the input clock period. Because the JEDEC standard specifies that the number of samples for a static phase offset measurement equals 2000 samples (denoted as $N_1$), the minimum number N of samples desirable for a DPO measurement becomes $N = \max[N_1, N_2]$ The following examples illustrate how N is calculated for two typical spread spectrum implementations. In a first implementation, the input clock has a base frequency of 20 MHz and is modulated according to a spread spectrum period ($T_{MOD}$) of 31,700 nano-seconds (ns). Thus, $T_{REF}$ equals 50 ns so that $N_2$ becomes 31,700/50, which equals 634 samples. The maximum of 2000 ($N_1$) and 634 ($N_2$) is 2000 so that the number of samples to properly determine the DPO is 2000 in such an implementation.

In a second implementation, the input clock has a base frequency of 133.3 MHz and is modulated according to a spread spectrum period ($T_{MOD}$) of 31,700 nano-seconds (ns). Thus, $T_{REF}$ equals 7.5 ns so that $N_2$ becomes 31,700/7.5, which equals 4227 samples. The maximum of 2000 ($N_1$) and 4227 ($N_2$) is 4227 so that the number of samples to properly determine the DPO is 4227 in such an implementation.

Figure 4:
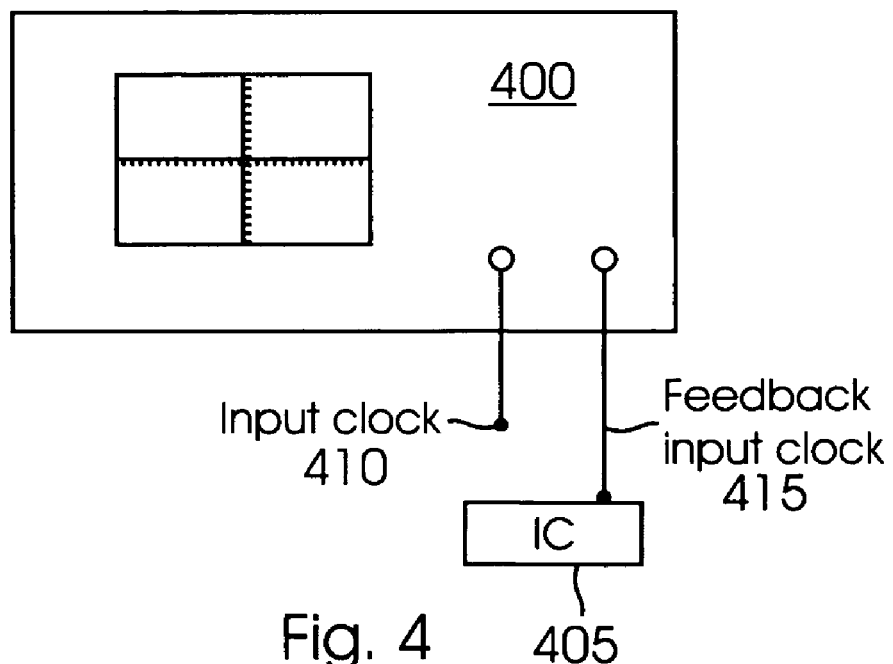
FIG. 4 illustrates an oscilloscope adapted to measure DPO in accordance with an embodiment of the invention.

Turning now to FIG. 4, an oscilloscope 400 is illustrated that is configured to measure DPO in accordance with the techniques described herein. Prior to making measurements, the oscilloscope has been configured to use an appropriate acquisition time window so as to obtain the proper number N of phase jitter measurements as discussed previously. Oscilloscope 400 may be configured to automatically determine the appropriate acquisition time window or the time window may be manually determined. The PLL under test (not illustrated) may be incorporated into an integrated circuit 405 adapted to provide a PLL input clock 410 and a PLL feedback input clock 415 to the oscilloscope. The oscilloscope compares the PLL input clock and PLL feedback input clock to perform the N phase jitter measurements of $t(\phi)_{SSCn}$ and $t(\phi)_n$ as discussed previously. For enhanced accuracy, the oscilloscope may be configured into a single data acquisition mode for minimum trigger jitter while performing the phase jitter measurements.

To measure the DPO, the PLL under test may first be configured into a static mode in which the input clock is not modulated. The oscilloscope then obtains N samples of the phase jitter $t(\phi)_n$. Turning now to FIG. 5, the phase jitter measurements may then be organized to form a histogram 500. As can be seen from inspection of FIG. 5, the phase jitter measurements form a Gaussian distribution about a mean value of zero. Half of the measurements correspond to positive jitter values and the remaining half correspond to negative jitter values. The range of histogram 500 extends from a most-negative jitter value 505 to a most-positive jitter value 510. This range may be designated as a peak-to-peak phase jitter (PJs) without input modulation.

A similar peak-to-peak phase jitter measurement may be performed with the input clock subject to a spread spectrum modulation such that the oscilloscope performs N measurements of $t(\phi)_{SSCn}$. Inspection of FIG. 2 indicates that the phase jitter is positive as the input clock is decreased in frequency and negative as the input clock is increased in frequency. If the N phase jitter measurements obtained from the oscilloscope while the input clock is spread spectrum modulated are arranged in a histogram 600 as seen in FIG. 6, two Gaussian distributions are thus formed. A first Gaussian distribution 605 is formed by the positive jitter values whereas a second Gaussian distribution 610 is formed by the negative jitter values. The range of histogram 600 extends from a most-negative jitter value 615 to a most-positive jitter value 620. This range may be designated as a peak-to-peak phase jitter (PJd) with input modulation. The dynamic phase offset is thus equal to PJd−PJs.

Embodiments described above illustrate but do not limit the invention. For example, although an oscilloscope is a convenient and efficient time domain instrument for the measurement of phase jitter, other time domain analytical instruments such as a time interval analyzer could be used to characterize DPO. Thus, it should be understood that numerous modifications and variations are possible in accordance with the principles of the present invention. Accordingly, the scope of the invention is defined by the following claims.

We claim:

1. A method of measuring a dynamic phase offset between a PLL's input clock and the PLL's feedback input clock, wherein the input clock is spread spectrum modulated in a spread spectrum mode and is not modulated in a static mode, comprising:

in the spread spectrum mode, measuring phase jitter between the input clock and the feedback input clock to form a spread spectrum phase jitter measurement;

in the static mode, measuring phase jitter between the input clock and the feedback input clock to form a static phase jitter measurement; and calculating a difference between the spread spectrum phase jitter measurement and the static phase jitter measurement to provide the measurement of the dynamic phase offset.

2. The method of claim 1, wherein the spread spectrum phase jitter measurement is measured over a number of input clock cycles and the static phase jitter measurement is measured over the same number of input clock cycles.

3. The method of claim 2, further comprising:

determining the number of input clock cycles by selecting the maximum of a predefined number and a number of cycles of the input clock within a period of the spread spectrum modulation.

4. The method of claim 2, wherein the number of input clock cycles is at least 2000.

5. The method of claim 1, wherein the spread spectrum phase jitter measurement includes a plurality of spread spectrum phase jitter measurements and the static phase jitter measurement includes a plurality of static phase jitter measurements.

6. The method of claim 5, wherein a range for the plurality of spread spectrum phase jitter measurements extends from a most positive spread spectrum phase jitter measurement to a most negative spread spectrum phase jitter measurement.

7. The method of claim 5, wherein a range for the plurality of static phase jitter measurements extends from a most positive static phase jitter measurement to a most negative static phase jitter measurement.

8. The method of claim 1, wherein measuring the phase jitter in the spread spectrum and static modes comprises measuring the phase jitter with an oscilloscope.

9. The method of claim 1, wherein measuring the phase jitter in the spread spectrum and static modes comprises measuring the phase jitter with a time interval analyzer.

* * * * *